(12) United States Patent
Roach

(10) Patent No.: US 7,049,759 B2
(45) Date of Patent: May 23, 2006

(54) CIRCUITRY AND METHODS FOR IMPROVING THE PERFORMANCE OF A LIGHT EMITTING ELEMENT

(75) Inventor: Steven D. Roach, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 10/003,096

(22) Filed: Dec. 6, 2001

(65) Prior Publication Data

US 2004/0070351 A1 Apr. 15, 2004

(51) Int. Cl.
*H05B 37/02* (2006.01)

(52) U.S. Cl. ................ 315/224; 315/169.1; 372/43

(58) Field of Classification Search ........ 315/169.1, 315/169.3, 224; 313/623–625, 631; 445/29, 445/44; 257/94; 438/14–18, 46; 372/50, 45, 372/43

See application file for complete search history.

(56) References Cited

U.S. PATENT DOCUMENTS

| | | | |
|---|---|---|---|
| 3,573,644 A | 4/1971 | Evel ........................ 330/9 |
| 4,761,788 A | 8/1988 | Dietrich et al. ............ 372/36 |
| 4,813,045 A | 3/1989 | Culpepper |
| 5,024,966 A | 6/1991 | Dietrich et al. ............ 437/60 |
| 5,121,075 A | 6/1992 | Roach ...................... 330/126 |
| 5,371,755 A | 12/1994 | Murata et al. ............. 372/38 |
| 5,625,636 A * | 4/1997 | Bryan et al. .............. 372/50 |
| 5,891,746 A * | 4/1999 | Kuchta ...................... 438/16 |
| 5,977,565 A | 11/1999 | Ishikawa et al. ........... 257/81 |
| 5,982,793 A | 11/1999 | Kobayashi et al. ......... 372/38 |
| 6,026,108 A * | 2/2000 | Lim et al. .................. 372/50 |
| 6,567,439 B1 | 5/2003 | Auracher et al. ........... 372/36 |
| 6,728,280 B1 * | 4/2004 | Tatum et al. .............. 372/43 |

FOREIGN PATENT DOCUMENTS

| | | |
|---|---|---|
| DE | 42 05 789 | 9/1993 |
| EP | 0 375 231 | 12/1989 |
| EP | 0 961 372 | 5/1999 |
| JP | 2-133980 | 5/1990 |
| JP | 4-167487 | 6/1992 |
| JP | 9-172221 | 6/1997 |
| JP | 09-307169 | 11/1997 |
| JP | 10-098451 | 4/1998 |
| JP | 10-270748 | 10/1998 |

OTHER PUBLICATIONS

British Search and Examination Report.

S. Maricot, J.P. Vilcot and D. Decoster, "Improvement of Microwave Signal Optical Transmission by Passive Matching of Optoelectronics Devices", Microwave Opt. Technology, vol. 4, No. 2, 1991, pp. 591–595.

S. Maricot, J.P. Vilcot, D. Decoster, J.C. Renaud, D. Rondi, P. Hirtz, R. Blondeau and B. deCremoux, Monolithic Integration of Optoelectronics Devices with Reactive Matching Networks for Microwave Applications, IEEE Photonics Technology Letters, vol. 4, No. 11, Nov. 1992, pp. 1248–1250.

(Continued)

*Primary Examiner*—Don Wong
*Assistant Examiner*—Jimmy Vu
(74) *Attorney, Agent, or Firm*—Fish & Neave IP Group of Ropes & Gray LLP; Robert W. Morris; Jeffrey D. Mullen

(57) ABSTRACT

Light emitting elements with preselected or adjustable impedance characteristics are provided. Embodiments using a preselected impedance characteristic obtain significant performance benefits compared to the prior art. Embodiments having an adjustable impedance may alter the impedance associated with the light emitting component such that it has a substantially constant resistive or reactive impedance that improves certain performance attributes. This solution virtually eliminates the need for external compensation components and relieves the burden of impedance matching and circuit specialization from the driver circuit.

47 Claims, 3 Drawing Sheets

OTHER PUBLICATIONS

S. Maricot, J.P. Vilcot, D. Decoster, J.C. Renaud, D. Rondi, P. Hirtz, R. Blondeau and B. deCremoux, "Reactively Matched Optoelectronics Transceivers on InP Substrate for 6 Ghz Operation", IEEE MTT–S International Microwave Symposium Digest, vol. 2, Jun. 14–18, 1993, pp. 1067–1070.

J.C. Renaud, D. Rondi, P. Hirtz, R. Blondeau, S. Maricot, J.P. Vilcot and D. Decoster, "Monolithic Integration of Both GaInAs Photodiodes and GaInAsP Lasers with Impedance Matching Circuits for 6 Ghz Transmissions", Proc. 4th Conf. InP Related Materials, Apr. 1992, pp. 78–81.

Addis, John, "Three technologies on one chip make a broadband amplifier", *Electronics The International Magazine of Electronics Technology*, Jun. 5, 1972, pp. 103–107.

Ahuja, B.K., "Implementation of Active Distributed RC Anti–Aliasing/Smoothing Filters",*IEEE Journal of Solid–State Circuits*, vol. SC–17, No. 6, pp. 339–342.

AMCC Product Brief 1.0/1.25GBPSVCSELDRIVER, May 10, 1999, pp. 1–3.

Ikalainen, Pertti, K. "An RLC Matching Network and Application in 1–20 GHZ Monolithic Amplifier", *IEEE MTT–S International Microwave Symposium Digest*, vol. I, 1989, pp. 1115–1118.

Khoury, John, M., "Synthesis of Arbitrary Rational Transfer Funtions is S Using Uniform Distributed RC Active Circuits", *IEEE Transactions on Circuits and Systems*, vol. 37, No. 4, Apr. 1990, pp. 464–472.

Khoury, John, M., "On the Design of Constant Settling Time AGC Circuits", *IEEE Transactions on Circuits and Systems*, vol. 45, No. 3, Mar. 1998, pp. 283–294.

Sackinger, Eduard, et al., "A 3GHz, 32dB CMOS Limiting Amplifier for SONET OC–48 Receivers", *IEEE International Solid–State Circuits Conference*, 2000, p. 158.

SUMMIT Microelectronics, Inc. "Dual Loop Laser Diode Adaptive Power Controller with Look Up Table" (SML2108), Oct. 3, 2001, pp. 1–21.

Swartz, R.G. et al., "An Integrated Circuit for Multiplexing and Driving Injection Lasers", *IEEE Journal of Solid–State Circuits*, vol. SC–17, No. 4, Aug. 1982, pp. 753–760.

Dascher, David J., "Measuring Parasitic Capacitance and Inductance Using TDR", *Hewlett–Packard Journal*, Apr. 1996, pp. 1–19.

MAXIUM, "Interfacing Maxim Laser Drivers with Laser Diodes", May 2000, pp. 1–12.

* cited by examiner

CIRCUITRY AND METHODS FOR IMPROVING THE PERFORMANCE OF A LIGHT EMITTING ELEMENT

BACKGROUND OF THE INVENTION

This invention relates to light emitting elements, and more particularly, to improving the performance characteristics of light emitting elements.

Light emitting elements such as light emitting diodes (LEDs), laser diodes, and vertical cavity surface emitting lasers (VCSELS) are used today in a wide variety of electronic applications. Common examples of products that employ light emitting elements include DVD players and high speed optical communications systems. Frequently, the role of light emitting elements involves the generation of light pulses for data acquisition or transmission. To function in this capacity, driver circuitry is typically utilized to supply the appropriate electrical differential across the light emitting element to generate digital optical signals.

Currently, many light emitting elements are fabricated with varying impedance values. A VCSEL, for example, typically has an impedance value that varies between about 17–50 Ohms. This variation poses problems for driver circuitry because of the likely impedance mismatch that results between the output of the driver circuitry and the input of the VCSEL. Foremost among these problems are the signal reflections that occur along the transmission line between the driver circuit and the VCSEL that reduce signal quality and limit response time.

Presently, this problem is dealt with by manipulating the operating characteristics of the driver circuitry. One popular solution, for example, includes the addition of external termination components that absorb reflected energy. This solution is not optimal because it requires system manufacturers to determine the impedance of each light emitting element individually and couple the appropriate compensation components to the driver circuitry. Other popular solutions include the use of precision driver modules that can accommodate an impedance mismatch without losing significant performance. Such systems, however, inevitably sacrifice certain amounts of bandwidth and frequency response.

Thus, in view of the foregoing, it would be desirable to provide circuits and methods that reduce or minimize the impedance variation associated with light emitting elements.

It would also be desirable to provide circuits and methods that enable adjustment of the transfer function associated with light emitting elements to improve or optimize certain performance attributes.

SUMMARY OF THE INVENTION

Thus, in view of the foregoing, it is an object of the present invention to provide circuits and methods that reduce or minimize the impedance variation associated with light emitting elements.

It is also an object of the present invention to provide circuits and methods that enable adjustment of the transfer function associated with light emitting elements to improve or optimize certain performance attributes.

These and other objects are accomplished in accordance with the principles of the present invention by providing light emitting elements with additional circuitry. The additional circuitry may have a preselected or adjustable impedance characteristic. Embodiments using a preselected impedance characteristic obtain significant performance benefits compared to the prior art. Embodiments having an adjustable impedance may alter the impedance associated with the light emitting component such that it has a substantially constant resistive or reactive impedance that improves certain performance attributes. This solution virtually eliminates the need for external compensation components and relieves the burden of impedance matching and circuit specialization from the driver circuit.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

FIG. 1 is an illustrative physical layout of a light emitting component 100 constructed in accordance with the principles of the present invention. Component 100 may include a bond pad 110, an adjustable resistor 120, and a light emitting element 130. Although component 100 is depicted as a "chip-on-board" type package, any other suitable packages types such a dual inline packages (DIPs) and "can" packages may be used if desired.

Light emitting element 130 may be any circuit element suitable for generating light pulses such as an LED, a laser diode, a VCSEL, etc. Adjustable resistor 120 may be created from any material suitable for forming resistive elements on an a substrate such as a metal resistor formed from the same material as bond pad 110 or a thin-film or thick-film type resistor.

Figure 2:
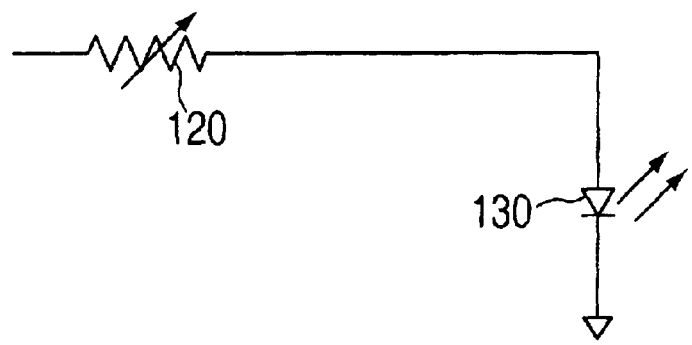
FIG. 2 is a schematic diagram of the physical layout shown in FIG. 1.

In operation, driver circuitry (not shown) is coupled to light emitting element 130 via bond pad 110, adjustable resistor 120, and signal paths 115 and 125. Signals from the driver circuitry pass through resistor 120 and into light emitting element 130 turning it ON and OFF to produce light pulses. A schematic representation of component 100 is shown in FIG. 2.

The purpose of adjustable resistor 120 is to normalize the impedance variation associated with light emitting element 130 so the equivalent input impedance of light emitting component 100 is a substantially constant predetermined value. For example, if a given light emitting element has an impedance of 29 Ohms, and another light emitting element manufactured from the same process has an impedance of 34 Ohms, resistors 120 may be adjusted to 21 Ohms and 16

Ohms, respectively, so that both components have an input impedance of 50 Ohms. This configuration allows circuit manufacturers to produce light emitting components having a predetermined substantially constant impedance and thus virtually eliminate the need for compensation components or other specialized circuit drivers.

Determining the proper value of adjustable resistor 120 may be accomplished in several ways. One method includes manufacturing component 100 and measuring the resistance of light emitting element 130. Next, the value of resistor 120 is adjusted (e.g., trimmed) so that the total impedance of component 100 as seen from bond pad 110 is set at a desired value (e.g., 50 Ohms).

Another way of adjusting resistor 120 includes measuring the resistance of component 100 from bond pad 110 and adjusting resistor 120 until the total impedance of component 100 as seen from bond pad 110 reaches the desired value.

In some instances, it may be desirable to adjust the value of resistor 120 while monitoring the optical response of component 100. This may be done to obtain a particular optical response from component 100 (e.g., to optimize an "eye opening") irrespective of input impedance.

In an alternate embodiment of component 100, resistor 120 may be fabricated to a nominal fixed value subject to variations associated with resistor fabrication (e.g., within about ±20% of the intended value). In this case, resistor 120 is not adjusted, and its function is merely to bring the total impedance of light emitting component 100 to a more desirable value. For example, assume the average impedance of a particular group of light emitting elements 110 is known to be 31.6 Ohms and to lie between 20 Ohms and 50 Ohms in all cases. In a commonly encountered 50 Ohm transmission line environment, a light emitting component would suffer from reflections of 43% at a minimum value of 20 Ohms. With this in mind, a manufacturer may construct resistor 120 such that its nominal value is also 18.4 Ohms subject to manufacturing tolerances so the final impedance of component 100 is about 50 Ohms. With this arrangement, the worst case reflection would be reduced by a factor of 2, or down to about 23%.

It will be appreciated from the above that the impedance of component 100 may be set to one of numerous values as specified, for example, by customer requirements. In most cases, the only restriction on this feature is the minimum impedance of light emitting element 130. Thus, if desired, the equivalent impedance of light emitting component 100 may be increased to values significantly greater than the original impedance value of light emitting element 100.

Furthermore, in an another embodiment of the present invention, a "template" version of component 100 may be provided with little or no adjustment of resistor 120. In this case, a user, such as a component manufacturer, may adjust resistor 120 to meet specific needs. For example, a template version of component 100 may be coupled to a specific driver circuit. Next, resistor 120 may be adjusted to attain a substantially perfect impedance match between the driver circuit and component 100 to optimize system performance. This type of "component customization" makes component 100 suitable for use in a wide variety of high performance applications such as those that involve coding schemes with high overheads or require fast data transfer rates with limited error tolerance.

It will be understood that resistor 120 may be adjusted during various stages of fabrication of component 100 including adjustment of the final product. For example, resistor 120 may be adjusted at the wafer level, during construction of the optical subassembly (e.g., when an optical connector is attached and aligned with element 130), during module assembly (e.g., the addition of driver circuitry and component packaging), or by an end item user.

Moreover, additional network components may be added to light emitting component 100 to adjust the current threshold (i.e., the magnitude of a drive signal required to produce a desired minimum light level) and the slope efficiency (i.e., the incremental response of the optical output signal of element 110 compared to the drive signal when the drive signal is above the threshold level) of light emitting element 130.

Figure 1A:
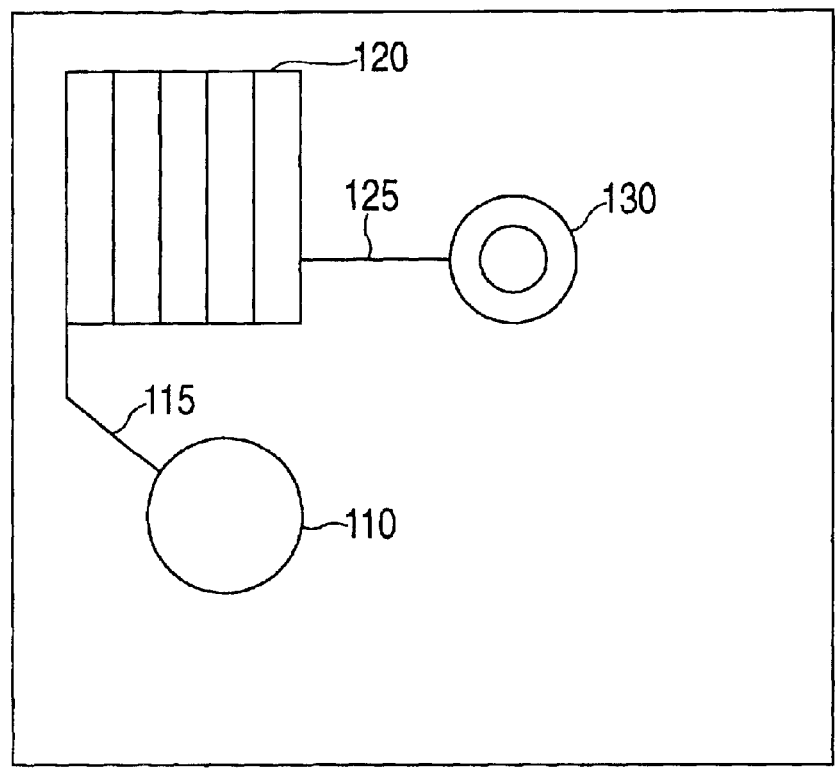
FIG. 1A is an illustrative physical layout of a light emitting component constructed in accordance with the principles of the present invention.
Figure 1B:
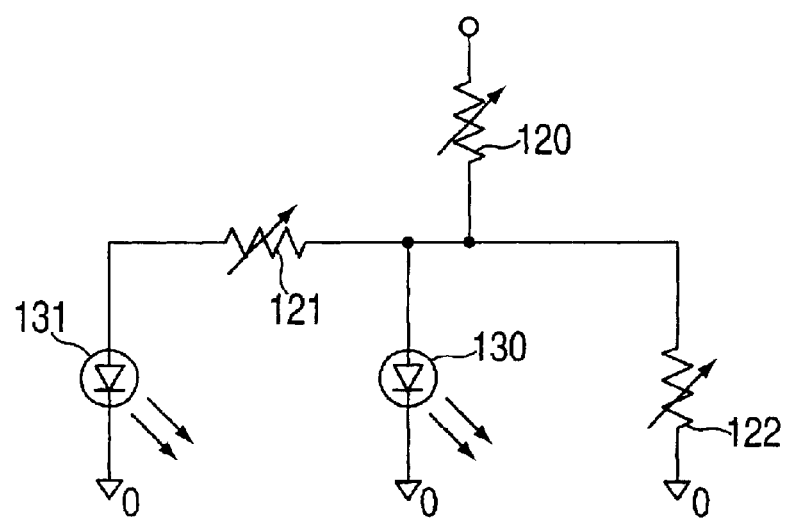
FIG. 1B is a schematic diagram of additional circuitry that may be included in the light emitting component of FIG. 1.

For example, as shown in FIG. 1B, adjustable resistors 121 and 122 and light emitting element 131 may be added to component 100, if desired. With this embodiment, light emitting element 131 acts as a voltage clamp to bias light emitting element 130. The optical output produced by element 131 is not necessarily used. Resistor 121 may be adjusted to divert a portion of an applied drive signal away from element 130 and into element 131, thereby reducing the optical output of element 130. With this capability, it is possible to vary the value of resistor 121 so that the optical output of element 130 reaches a predetermined level for a given value of drive current. This allows the selection of predefined and substantially constant electrical-to-optical conversion parameters for component 100 despite the large variations in efficiency commonly associated with element 130.

In addition, the current threshold at which light emitting element 130 emits light may be set to a predetermined value by adjusting variable resistor 122.

It will be appreciated that the features of the present invention shown in FIGS. 1A and 1B may be used separately, together, or in various combinations depending upon the desired functionality. For example, component 100 may be constructed such that it includes only light emitting element 130 and variable resistor 122. In this embodiment, component 100 would have a preset current threshold but not a preset input impedance or a normalized electrical-to-optical conversion efficiency. All combinations and permutations of these features shall be recognized as within the scope of the present invention.

Figure 3:
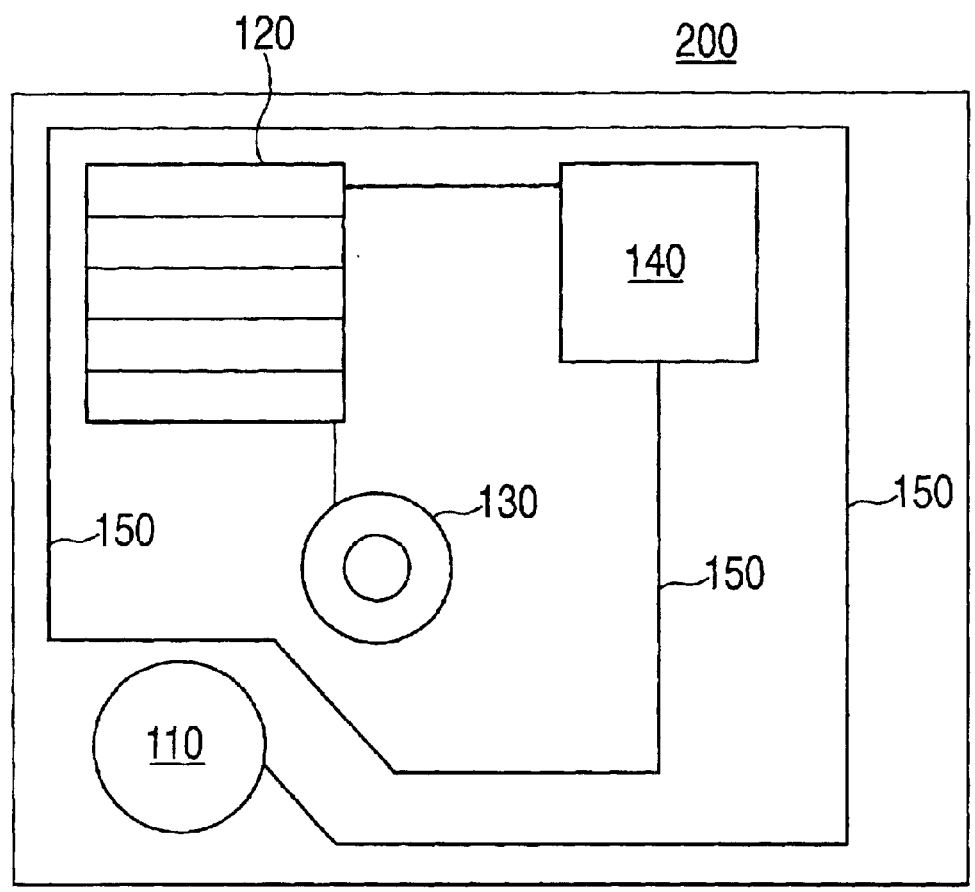
FIG. 3 is an illustrative physical layout of another light emitting component constructed in accordance with the principles of the present invention.

FIG. 3 is an illustrative physical layout of a light emitting component 200 constructed in accordance with the principles of the present invention. Component 200 is similar to component 100 and further includes adjustable capacitor 140 and adjustable inductor 150. Although component 200 is depicted as a "chip-on-board" type package, any other suitable packages types, such as a dual inline packages (DIPs) and "can" packages may be used if desired. Component 200 may also employ some or all of the circuit elements shown in FIG. 1B.

The primary purpose of adjustable capacitor 140 and adjustable inductor 150 is to permit variation of the transfer function associated with light emitting component 200. With this arrangement, circuit manufacturers may produce light emitting components with specialized transfer functions that improve or optimize certain performance characteristics. For example, by adjusting the values of some or all of the circuit elements on component 200, it is possible to obtain a substantially resistive characteristic impedance (e.g., by "tuning out" or compensating for package and coupling reactance).

The arrangement of FIG. 3 may also be used to create transfer functions that improve or optimize other performance characteristics such as high frequency response, time domain response, transition time, settling time, bandwidth, jitter, etc. Such optimization may include adjusting some or all of the circuit elements on component 200 to vary the shape of an optical pulse produced by element 130 to conform with a certain "mask" or to be compliant with a particular communications standard (e.g., SONET).

In an alternate embodiment of component 200, capacitor 140 and inductor 150 may be fabricated to nominal fixed values subject to variations associated with component fabrication (e.g., within about ±20% of the intended value). In this case, these components are not adjusted, and their function is merely to improve one or more of the above-mentioned performance characteristics of component 200.

Figure 4:
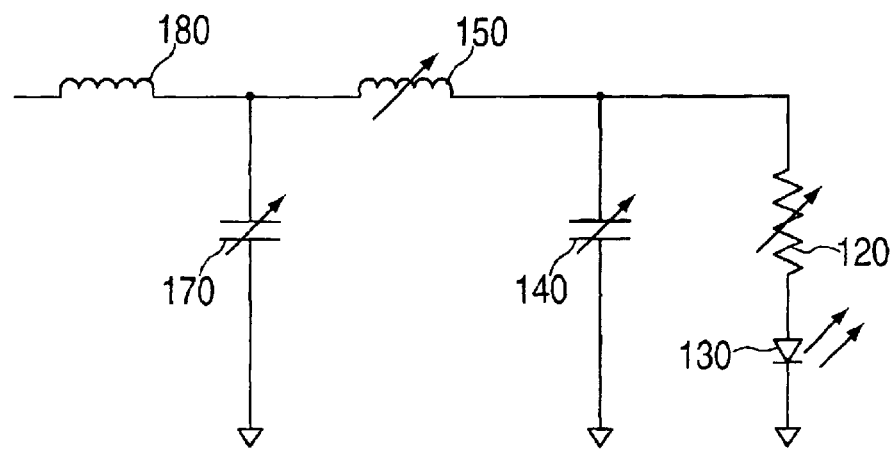
FIG. 4 is a schematic diagram of the equivalent circuit associated with the physical layout shown in FIG. 3.

FIG. 4 shows an equivalent circuit of the physical layout shown in FIG. 3. In FIG. 4, inductor 180 represents the inductance associated with a bond wire that connects to bond pad 110 (not shown), and capacitor 170 represents the capacitance associated with bond pad 110. Light emitting element 130 is schematically represented as a laser diode.

Figure 5:
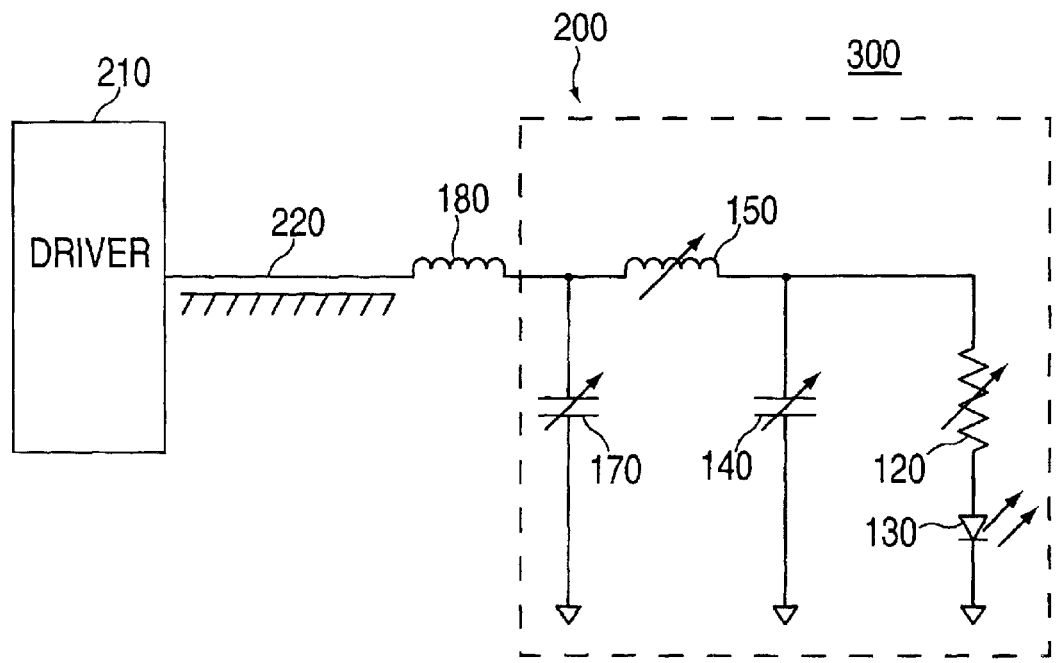
FIG. 5 is a schematic diagram of a light emitting component constructed in accordance with the principles of the present invention coupled to driver circuitry through a transmission line.

FIG. 5 shows a driver circuit 210 coupled to light emitting component 200 through a transmission line 220. In this embodiment, the value of resistor 120 may be adjusted to normalize the impedance of light emitting element 130 to a value matching the characteristic impedance of transmission line 220 for proper line termination. The values of adjustable capacitor 140 and adjustable inductor 150 may be set to compensate for transients associated with packaging reactance. In other embodiments, driver circuit 210 may be coupled directly to component 200 using "chip-to-chip wire bonding" with no intervening transmission line (not shown). In this case, the value of bond wire inductance 180 may be somewhat greater than that associated with arrangement in FIG. 5.

It will be appreciated, that, in many cases circuit elements 120, 140, and 150 may be disposed on light emitting components 100 and 200 without deviating from normal fabrication techniques. For example, inductors, capacitors, and resistors may all be formed from the metal used to make bond pads and circuit traces.

A spiral inductor, for example, having a value of approximately 1.2 nH may be formed by creating three concentric metal spirals having an outermost diameter of about 100 μm using 5 μm wide metal spaced apart about 1 μm. This specific implementation is merely exemplary and many other inductor configurations are possible. The inductance value may be increased or decreased as desired by changing the diameter of the spiral, the width of the metal, and the spacing between the portions of the metal used to form the inductor. Further, the inductor may be generally arranged as shown in FIG. 3 to avoid overlapping with other metal traces.

Capacitors may be formed by depositing a metal plate on top of the die used to form the light emitting component. The resulting capacitance depends on the size of the metal plate and the process used to create the die.

Various other known integrated circuit processing techniques may be used if desired to enhance the performance of these passive circuit elements. For example, masking, plating, and etching techniques may be used to thicken inductor metal or thin resistor metal to lower resistance. A high resistance base metal such as SiCr, NiCr, or tungsten may be used to form resistors. Thin or thick film conductive layers may be added to the die to form physically smaller resistors having large resistance values with reduced parasitic capacitance to the substrate. Thin or thick film dielectric layers may be added to form parallel plate capacitors or to allow trace crossovers. Diffused or ion implanted resistors, junction capacitors, and conductors may be created using photo lithographical techniques, etc.

It will be further appreciated that various methods may be used to adjust the values of the above-described components. For example, trimming may be done with a laser or abrasive on capacitor 140 or resistor 120. Such trimming may be performed while measuring the resistance, capacitance, or other parameters of light emitting components 100 and 200. Resistor 120, capacitor 140, and inductor 150 may be trimmed with a continuous adjustment, or by cutting constituent segments or tabs in discrete steps. Any such suitable method may be used. In certain embodiments, component adjustment may be done economically at the wafer level before the wafer is cut into individual components.

Persons skilled in the art will appreciate that the present invention can be practiced by other than the described embodiments, which are presented for purposes of illustration and not of limitation, and the present invention is limited only by the claims which follow.

What is claimed is:

1. A method for providing a light emitting component with a predetermined input impedance comprising:
   providing a light emitting element disposed on a substrate;
   providing an impedance circuit disposed on the substrate that is coupled to the light emitting element, wherein the light emitting element and the impedance circuit are fabricated on a single substrate;
   adjusting an impedance of the impedance circuit so that the equivalent input impedance of the light emitting component is set to the predetermined value.

2. The method of claim 1 further comprising determining the impedance of the light emitting element.

3. The method of claim 1 further comprising determining the impedance of the light emitting component.

4. The method of claim 1 wherein the providing an impedance circuit includes providing an adjustable resistor.

5. The method of claim 4 wherein the adjusting further comprises adjusting a resistance value of the adjustable resistor.

6. The method of claim 1 wherein the adjusting further comprises adjusting the input impedance of the light emitting component such that the input impedance is substantially resistive.

7. The method of claim 1 wherein the providing an impedance circuit includes providing an adjustable inductor.

8. The method of claim 1 wherein the adjusting further comprises adjusting an inductance value of the adjustable inductor.

9. The method of claim 1 wherein said providing an impedance circuit includes providing an adjustable capacitor.

10. The method of claim 9 wherein the adjusting further comprises adjusting a capacitance value of the adjustable capacitor.

11. The method of claim 1 wherein the adjusting further comprises adjusting the impedance of the impedance circuit to substantially compensate for a reactive impedance associated with the light emitting element so that the equivalent input impedance of the light emitting component is substantially resistive.

12. The method of claim 1 characterized by the use of a vertical cavity surface emitting laser (VCSEL) as the light emitting element.

13. The method of claim 11 wherein the adjusting further comprises trimming circuit components in the network.

14. A method for providing a light emitting component having an input impedance that substantially matches a characteristic impedance of a transmission line comprising:
   providing a light emitting element disposed on a substrate;
   providing an impedance circuit disposed on the substrate that is coupled to the light emitting element, wherein the light emitting element and the impedance circuit are fabricated on a single substrate;
   adjusting an impedance of the impedance circuit so that the input impedance of the light emitting component substantially matches the characteristic impedance of the transmission line.

15. A method for providing a light emitting component having an input impedance that substantially matches an output impedance of a driver circuit comprising:
   providing a light emitting element disposed on a substrate;
   providing a variable impedance circuit disposed on the substrate that is coupled to the light emitting element, wherein the light emitting element and the impedance circuit are fabricated on a single substrate;
   adjusting an impedance of the impedance circuit so that the input impedance of the light emitting component substantially matches the output impedance of the driver circuit.

16. A method for obtaining a desired frequency response from a light emitting element disposed on a substrate comprising:
   determining the desired frequency response of the light emitting element to an input signal;
   providing a network with a variable transfer function coupled to the light emitting element and disposed on the substrate, wherein the light emitting element and the network are fabricated on a single substrate; and
   adjusting the transfer function of the network to obtain the desired frequency response from the light emitting element.

17. The method of claim 16 wherein the transfer function is adjusted to optimize bandwidth of the light emitting element.

18. The method of claim 16 wherein the transfer function is adjusted to optimize high frequency response of the light emitting element.

19. The method of claim 16 wherein the providing includes providing an adjustable resistor in the network.

20. The method of claim 19 wherein the adjusting further comprises adjusting a resistance value of the adjustable resistor.

21. The method of claim 16 wherein the providing includes providing an adjustable inductor in the network.

22. The method of claim 21 wherein the adjusting further comprises adjusting an inductance value of the adjustable inductor.

23. The method of claim 16 wherein the providing includes providing an adjustable capacitor in the network.

24. The method of claim 23 wherein the adjusting further comprises adjusting a capacitance value of the adjustable capacitor.

25. The method of claim 16 wherein the adjusting further comprises trimming circuit components in the network.

26. A light emitting component comprising:
   a light emitting element disposed on a substrate for emitting light; and
   an adjustable impedance network disposed on the substrate and coupled to the light emitting circuit for adjusting the impedance of said light emitting component to a desired value, wherein the light emitting element and the impedance network are fabricated on a single substrate.

27. The light emitting component of claim 26 wherein the light emitting element is a vertical cavity surface emitting laser (VCSEL).

28. The light emitting component of claim 26 wherein the impedance network includes a resistor.

29. The light emitting component of claim 28 wherein the resistor is adjustable.

30. The light emitting component of claim 26 wherein the impedance network includes a capacitor.

31. The light emitting component of claim 30 wherein the capacitor is adjustable.

32. The light emitting component of claim 26 wherein the impedance network includes an inductor.

33. The light emitting component of claim 32 wherein the inductor is adjustable.

34. The circuit defined in claim 26 wherein the impedance network is formed, at least in part, from metal disposed on the surface of the substrate.

35. The light emitting component of claim 26 wherein the impedance network is adjustable by an end-item user.

36. The light emitting component of claim 26 wherein the impedance network is adjustable at the wafer level.

37. The light emitting component of claim 26 wherein the impedance network is adjustable at the optical subassembly level.

38. The light emitting component of claim 26 wherein the impedance network is adjustable at the module level.

39. A light emitting component comprising:
   a light emitting element fabricated on a substrate for emitting light;
   an impedance network fabricated on the substrate and coupled to the light emitting circuit, wherein the light emitting element and the impedance network are fabricated on a single substrate; and
   circuitry for establishing a current threshold of the light emitting component.

40. A light emitting component comprising:
   a light emitting element fabricated on a substrate for emitting light;
   an impedance network fabricated on the substrate and coupled to the light emitting circuit, wherein the light emitting element and the impedance network are fabricated on a single substrate; and
   circuitry for adjusting a current threshold of the light emitting component.

41. A light emitting component comprising:
   a light emitting element fabricated on a substrate for emitting light;
   an impedance network fabricated on the substrate and coupled to the light emitting circuit, wherein the light emitting element and the impedance network are fabricated on a single substrate; and
   circuitry for adjusting a slope efficiency of the light emitting component.

42. A light emitting component comprising:
   a light emitting element fabricated on a substrate for emitting light;
   an impedance network fabricated on the substrate and coupled to the light emitting circuit, wherein the light emitting element and the impedance network are fabricated on a single substrate; and circuitry for establishing a slope efficiency of the light emitting component.

43. A method for obtaining a desired response from a light emitting element disposed on a substrate comprising:

determining the desired response of the light emitting element to an input signal;

providing a network with a variable transfer function coupled to the light emitting element and disposed on the substrate, wherein the light emitting element and the network are fabricated on a single substrate; and adjusting the transfer function of the network to obtain the desired response from the light emitting element.

44. A method of claim 43 wherein the desired response is a desired time domain response, and wherein the adjusting further comprises adjusting the transfer function of the network to obtain the desired time domain response.

45. A method of claim 43 wherein the desired response is a predetermined settling time, and wherein the adjusting further comprises adjusting the transfer function of the network to obtain the predetermined settling time.

46. A method of claim 43 wherein the desired response is extended bandwidth, and wherein the adjusting further comprises adjusting the transfer function of the network to obtain the desired extended bandwidth.

47. A method for providing a light emitting component having an input impedance within a predetermined range comprising:

selecting a range of impedance values;

providing a light emitting element disposed on a substrate; and providing an impedance circuit disposed on the substrate and coupled to the light emitting element so that the input impedance of the light emitting component is within the selected range, wherein the light emitting element and the impedance circuit are fabricated on a single substrate.

* * * * *